United States Patent [19]

Catiller

[11] 4,430,735
[45] Feb. 7, 1984

[54] APPARATUS AND TECHNIQUE FOR TESTING IC MEMORIES

[75] Inventor: Robert D. Catiller, Garden Grove, Calif.

[73] Assignee: Burroughs Corporation, Detroit, Mich.

[21] Appl. No.: 267,048

[22] Filed: May 26, 1981

[51] Int. Cl.³ ............................................ G01R 31/28
[52] U.S. Cl. ...................................... 371/25; 371/28; 324/73 R
[58] Field of Search ............................ 371/25, 28, 20; 365/201; 324/73 R

[56] References Cited

U.S. PATENT DOCUMENTS

| B 483,268 | 3/1976 | Chu et al. | 324/73 R |
| 3,995,215 | 11/1976 | Chu et al. | 324/73 R |
| 4,025,768 | 5/1977 | Missios et al. | 371/28 |
| 4,053,751 | 10/1977 | Ault | 365/201 |
| 4,285,059 | 8/1981 | Barlage et al. | 371/25 |
| 4,332,028 | 5/1982 | Joccotton et al. | 324/73 R |
| 4,335,457 | 6/1982 | Early | 371/20 |

Primary Examiner—Jerry Smith
Assistant Examiner—Michael R. Fleming
Attorney, Agent, or Firm—Alfred W. Kozak; Nathan Cass; Kevin R. Peterson

[57] ABSTRACT

Apparatus and a technique is disclosed for testing the access time of electronic storage arrays such as bistable storage cells fabricated in accordance with integrated circuit technology. A test pattern generator generates addresses on an "increment-complement" system and applies these addresses to a memory such as a PROM being tested. All combinations of the rows and columns of the PROM are exercised. Output data from the PROM is split into two separate buses which constitute a direct output bus and a delayed output bus. A first digital comparator compares the respective data signals for each output line on each of the buses in order to ensure that the "stabilized" output data corresponds exactly to the direct output data. A second digital comparator can be set to establish a standard for the minimum time period at which the output data from the tested PROM has become acceptably stabilized. Specialized clocking and controlled delay times are provided by a digital access control unit.

10 Claims, 8 Drawing Figures

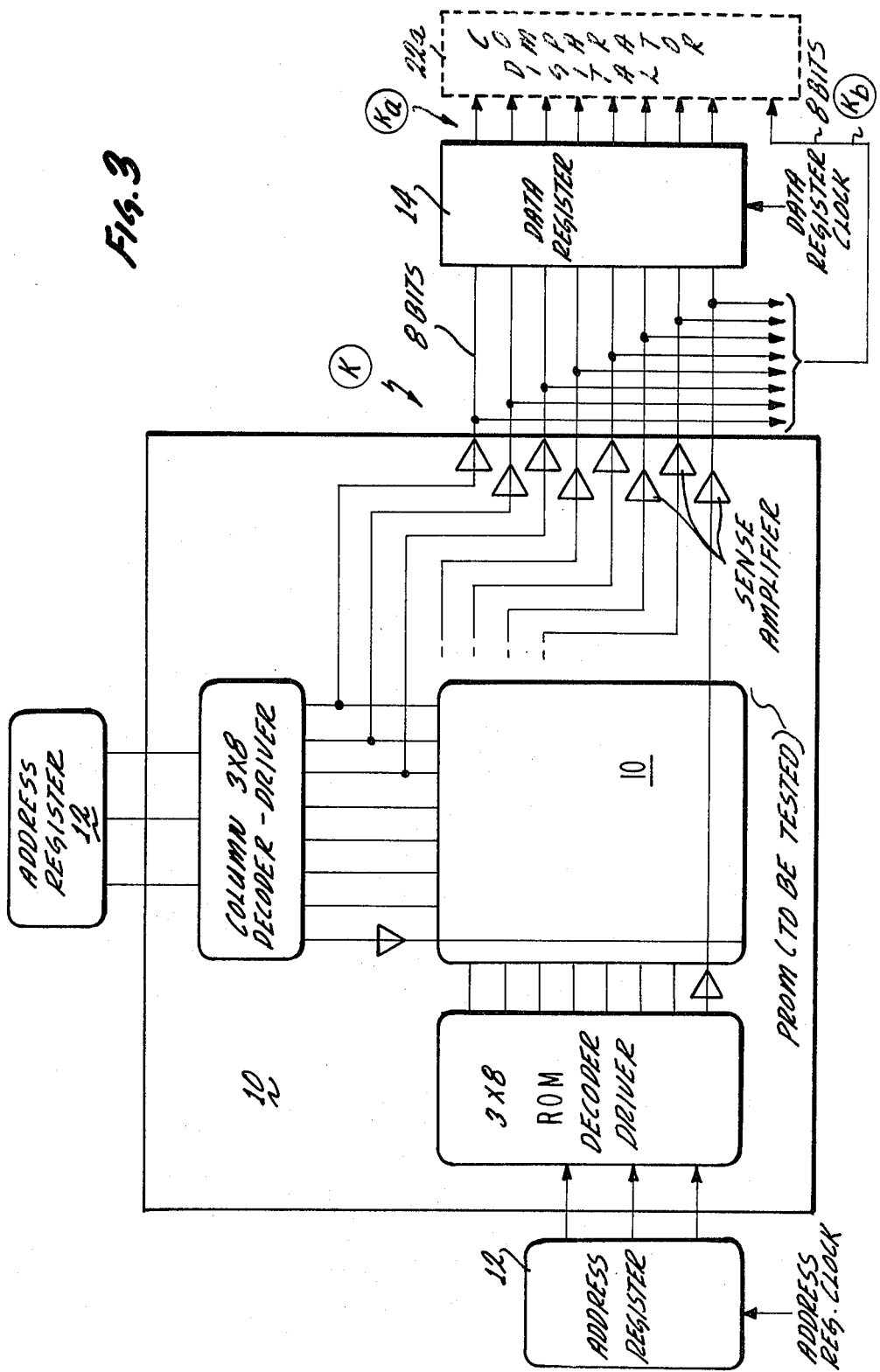

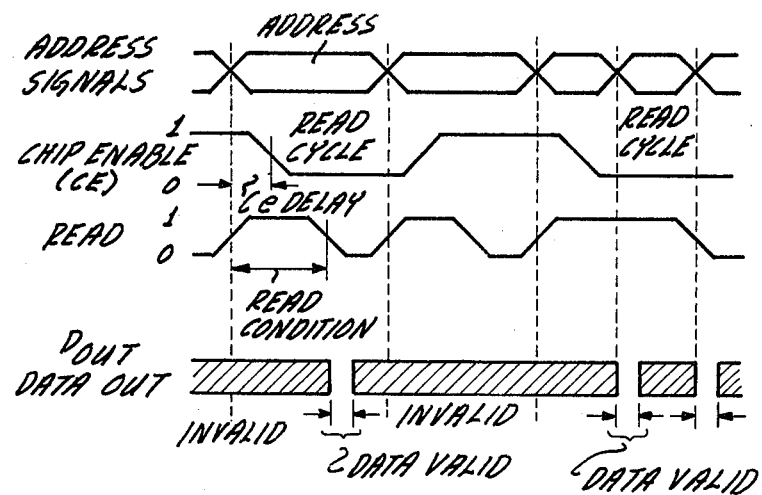
TYPICAL PROM ADDRESS-ACCESS CYCLE Fig. 4A
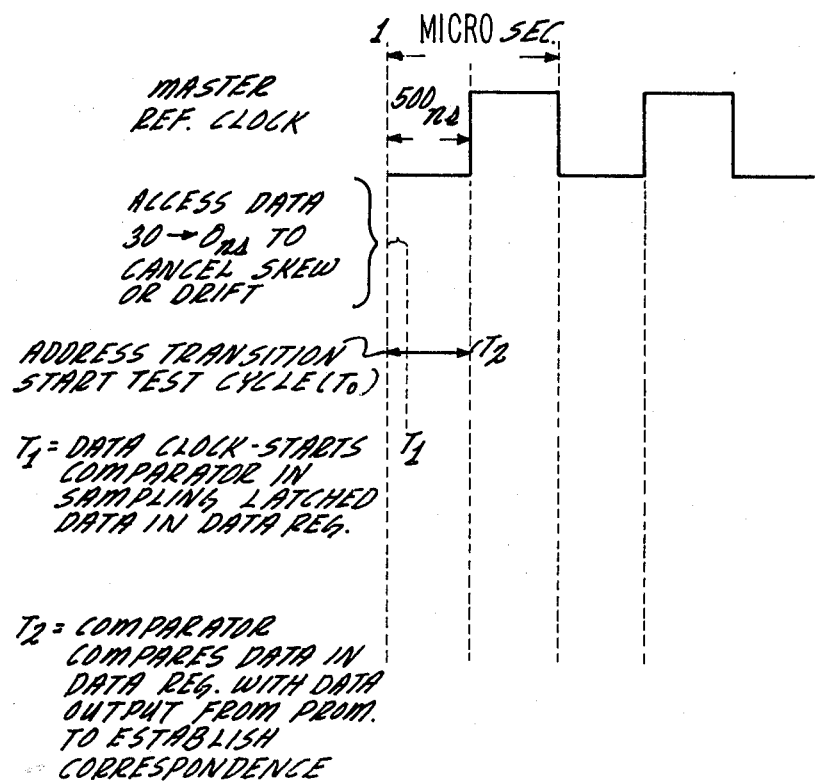
Fig. 4B

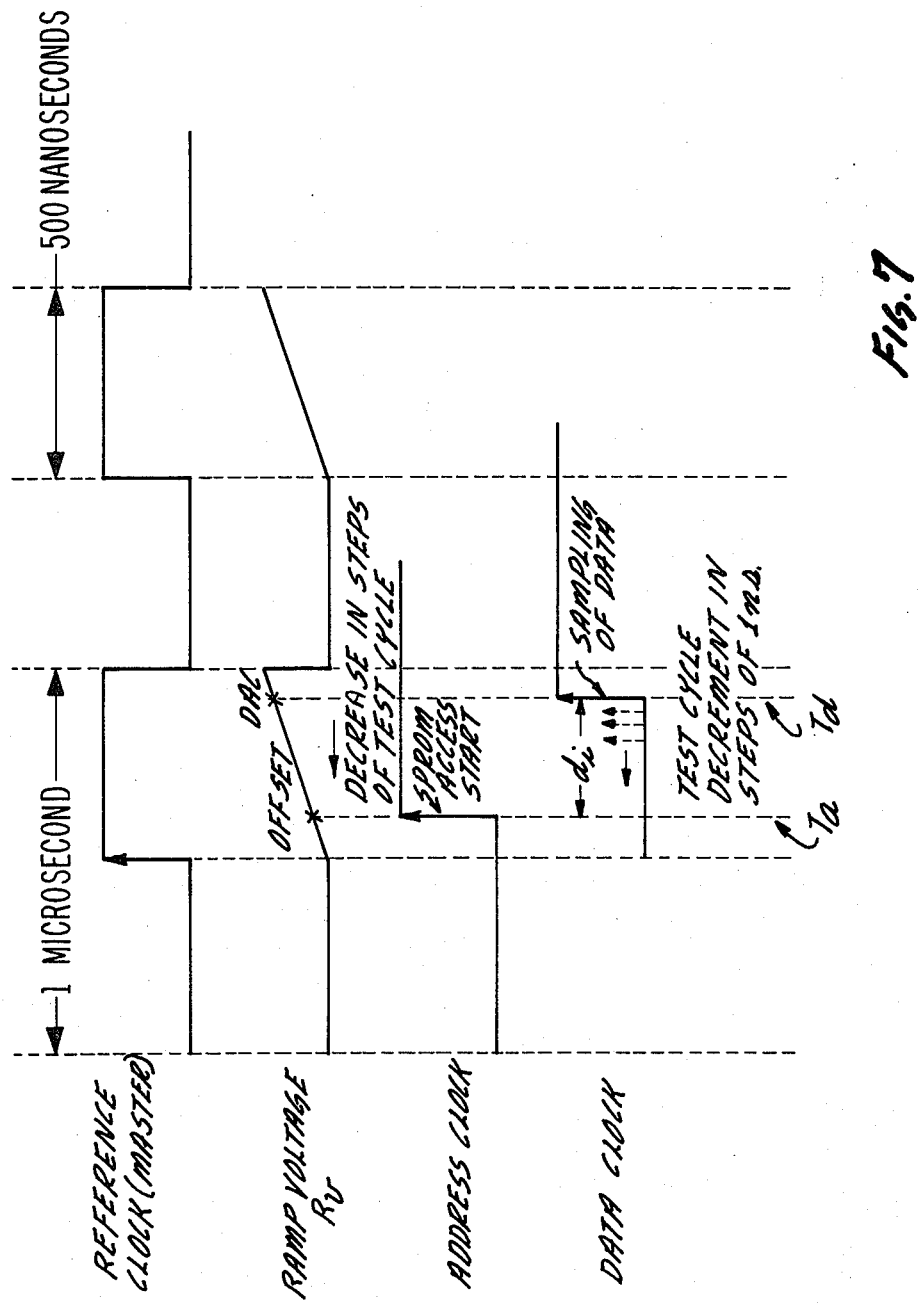

APPARATUS AND TECHNIQUE FOR TESTING IC MEMORIES

FIELD OF THE INVENTION

This invention relates to the extremely rapid testing of semi-conductor memories such as PROMs and apparatus which facilitates this purpose in an exceptionally inexpensive manner with few components.

CROSS REFERENCES TO RELATED APPLICATIONS

This application is related to other patent applications filed on the same data and designated as "Test Pattern Address Generator", Ser. No. 267,041, filed May 26, 1981, inventor Robert D. Catiller; patent application entitled "Comparison Circuit", Ser. No. 267,072, filed May 26, 1981, inventor Robert D. Catiller; and also a patent application entitled "Dual Clocking Time Delay Generation Circuit", Ser. No. 267,071, filed May 26, 1981, inventor Robert D. Catiller, and now U.S. Pat. No. 4,379,265.

BACKGROUND

With the rapid use of integrated circuit memories and various types of PROM memories, considerable efforts have been made to establish the reliability of such devices and to inspect and test production multitudes of such devices with efforts that are reasonable in time and cost.

In the prior and existing arts, semi-conductor memory devices have been tested with long, expensive and costly procedures whereby a computer is programmed to address all possible data combinations in the tested-memory and then using a previously stored standard of what data should be in the memory, then to make individual comparisons of the standard against each data bits in the tested memory. This required the use of a main computer and main memory, in addition to special programming procedures which were very costly and further required relatively long time periods to exercise the memory and to check all of its internal data with an external standard.

The use of semi-conductor memories and PROMs particularly involves a multi-million dollar industry that is continuously expanding. The use of millions of said semi-conductor memories not only brings up problems of production, but especially of testing that production, to see if the produced items are workable and reliable and especially how quickly the memories can respond (access time) with stable output of accessed data.

Many attempts have been made to handle the problem of weeding out defective PROMs and establishing their access time or speed of response. When defective uncalibrated PROMs get into the production line, they involve systems which can cause untold losses in terms of down time, production loss, customer upset and debugging problems. It is necessary that there be some way of eliminating defective PROMs using minimal testing time in order to save millions of dollars in repairing, debugging and rebuilding systems which might arise from defective or slow PROMs.

Thus, much effort and expense has been devoted to the testing and calibration of the response time of semi-conductor memories. And the expense of such testing can sometimes become almost prohibitive when it requires special programming, special computer apparatus, and long periods of operation time in order to test a single memory or a group of memories.

The herein described apparatus and technique for testing of semi-conductor memories involves a very minimal cost of apparatus and provides an automatic test procedure which steps through a series of "access times" of diminishing values (done for each bit accessed from the memory being tested). Upon the first detection of instability or access error, the test cycle is shut off and a display readout is made of the "reliable" time period of access. This permits the tested memory to be identified as to its lowest reliable access time period and below which there is no reliability. The unit described herein can test reliability of memories down to "access time" periods of a few nanoseconds.

SUMMARY OF THE INVENTION

The present invention resolves the burdensome requirements of long-test-periods, complex programming with a main computer, and need for extensive, complex and expensive apparatus. Now, a relatively few simple elements can be arranged to exercise and test semi-conductor memories with exceptional reliability totally in a period of one second or less and at an equipment and labor cost factor of one-thousandth the cost for prior methods.

A test pattern generator, operating on an increment-complement pattern address system provides a series of addresses which exercise all combinations of the row and column drivers of the semi-conductor memory in a fashion that provides output data resulting from exercising the worst case transitions within the semi-conductor memory. The individual bits of each data word accessed are checked for accuracy during a test period which cycles from 255 nanoseconds down to 0 nanoseconds in order to establish the fastest access time of the output data while still valid and reliable.

The addresses established by the test generator are latched into an address register after which the starting address is clocked into the memory being tested at an initial starting time by means of an address register clock activated from a digital access control unit.

When memory data bits are output from the memory being tested, they are split into two paths. One path of output data is fed directly to a digital comparator while the other path is latched into a data register. The data latched in the data register is then clocked by a data register clock, to the digital comparator which compares the latched data with the directly applied data to ensure that each corresponding bit is equal to its counterpart.

A digital access control unit clocks the address register and then clocks the data register. A controlled delay is established between the data register and the address register for a test cycle which starts at 255 nanoseconds and reduces down to 0 nanoseconds. Thus, for each output data word accessed from the tested memory, the digital comparator makes a series of correspondence tests at the 255 nanosecond level, the 254 nanosecond level, 253 nanosecond level, decrementing 1 nanosecond sequentially in order to make a correspondence test until such time that lack of correspondence of the output data indicates that a point of instability of output has been reached. These lower access time values are thus no longer reliable access periods.

A digital down counter, which cycles from 255 nanoseconds down to 0 nanoseconds for each test period, is connected to energize the digital access control circuit which regulates the delay time between the address clock and the data clock. A second digital comparator provides a thumbwheel adjustable setting for determining the acceptable access time deemed acceptable. A set of displays attached to the second digital comparator will indicate whether a given semi-conductor memory being tested will meet the access time requirements set by the adjustable thumbwheel setting.

One salient feature of the present apparatus and system for PROM testing is that it is not necessary to know the particular data pattern burned into the PROM since the integrity of the data and transitions from one address to a new data address is compared continuously for the previous data access and the later data access. Thus, great savings are possible in the no-longer-needed requirement for storage of the "known" pattern of the PROM which is to be compared to the actual tested pattern of the PROM.

BRIEF DESCRIPTION OF THE DRAWINGS

FIG. 3 is a schematic drawing of a typical PROM memory being tested by being addressed by the address register and providing output data to a data register.

FIG. 4A shows a timing diagram indicating how the addressing of a typical semi-conductor memory involves delays before output data can be considered as valid data.

FIG. 4B shows a timing diagram illustrating certain parts of the testing cycle.

FIG. 7 illustrates the ramp voltage generated by the digital access control module and how this ramp voltage is used to time the address clock and the data clock.

GENERAL OPERATION

Figure 1:
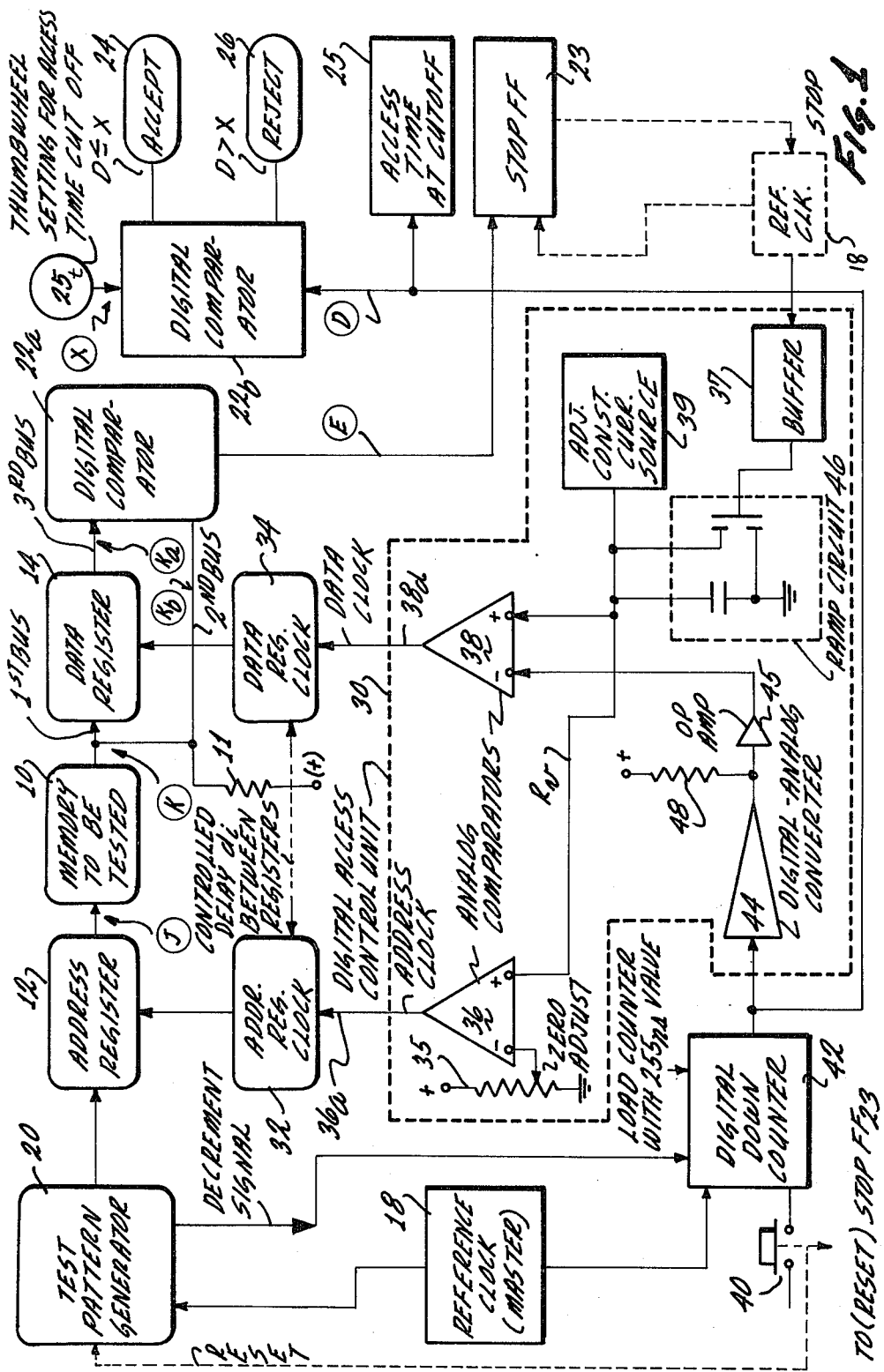
FIG. 1 shows a block diagram of the apparatus for testing semi-conductor memories by establishing the minimum allowable access time for reliable operation.

Referring to FIG. 1, a memory-to-be-tested 10 is connected at points J and K between an address register 12 and data register 14. A test pattern generator 20 generates addresses which exercise the memory 10 by providing a sequence of memory addresses.

The moment of clocking-in the address to the memory 10 is regimented by address clock 32 which starts the test cycle. Subsequently, a predetermined time later, the data clock is triggered from the digital access control unit 30 to convey latched data from data register 14 to a digital comparator $22_a$. The delay period $d_i$ between the address clock and the data clock is a variable period which starts at 255 nanoseconds and decrements in steps of 1 nanosecond down toward a 0 delay or 0 nanoseconds of $d_i$.

Since the output data of memory 10 appearing at point K is split into two paths, a direct path $K_b$ and a path which is first latched in data register 14, thus to appear on bus $K_a$, the digital comparator $22_a$ can compare the values of the eight bits on bus $K_a$ with the values of the eight bits of data on bus $K_b$ at each period of delay $d_i$ until such time as instability and lack of correspondence occurs between $K_a$ and $K_b$—values which indicate the breakdown point or non-reliability of data at that given "access time".

Thus, when the control delay $d_i$ is 255 nanoseconds, comparator $22_a$ will compare data of bus $K_a$ with the data in bus $K_b$ to see that exact correspondence occurs on the value of each bit. Then the delay $d_i$ is decremented to 254 nanoseconds and the same comparison between $K_a$ and $K_b$ is accomplished. This is again done at 253 nanoseconds, 252 nanoseconds, etc. etc. down to, say for example, 100 nanoseconds, at which time the digital comparator $22_a$ senses that the data on $K_a$ does not correspond to the data on $K_b$. At this moment comparator $22_a$ will trigger the stop flip-flop 23 which will stop the master reference clock 18 and the digital access control unit 30.

A digital down counter 42 is clocked by the master reference clock 18 and loaded with a 255 nanosecond value at the beginning of each test cycle, after which the test pattern generator will provide a decrement signal which recycles the digital down counter so that it decrements its output signal (1 nanosecond at a time) until finally the master clock 18 is turned off (or else a 0 nanosecond period is reached). The digital down counter provides a signal input D to the second digital comparator $22_b$ and also provides an output to an access time display 25. For example, should the stop flip-flop 23 be operated at the 100 nanosecond level (as indicative of non-equality of data on $K_a$ and $K_b$), then the 100 nanosecond cut-off point would be displayed on the access time display 25.

A second digital comparator $22_b$ has a thumbwheel settable access time cut-off point 25 which provides input to the digital comparator $22_b$. This is used to set a standard for acceptability or rejectability of a given memory 10 being tested. For example, if the thumbwheel-adjustable setter 25 is set to a period of 50 nanoseconds as the standard cut-off point, then if a memory 10 being tested operates reliably to the point where D is 50 nanoseconds, then the "acceptance display" 24 will operate. If, however, the stop flip-flop shuts off the system before the access time period of 50 nanoseconds is reached, then the digital value D from the down counter will, of course, be greater than the setting of the thumbwheel setter (50 nanoseconds) and thus the memory 10 would be considered as a "reject" on display 26.

DESCRIPTION OF THE PREFERRED EMBODIMENT

Referring to FIG. 1 there is seen a memory testing circuit particularly applicable to semi-conductor memories such as bipolar PROMs. A memory to be tested, such as a PROM 10, is connected to an address register 12 and a data register 14 at connection line points J and K. J and K represent bus connections connected to a fixture having connection points whereby the memory 10 can be plugged into the connection points for test purposes and easily removed.

The address register 12 is fed a series of addresses sequentially in a particular test pattern by means of test pattern generator 20 which is clocked by a master reference clock 18 operating under crystal control at a 1 megahertz rate.

Each output address from the test pattern generator 20 is latched into the address register 12 until such time as an address clock signal from address register clock 32 is conveyed to address register 12 to initiate the placement of the address signals on to the memory 10 to be tested.

As seen in FIG. 4A, some period of time occurs after application of the address signals and the "chip enable" signal to provide a read condition, and then eventually the memory 10 outputs a data output signal which becomes "valid" reliable data.

The data output from memory 10, in FIG. 1, is split into two paths at connection point K. Reference to FIG. 3 (showing an 8 bit address system) will show that at connection point K the output lines of the PROM memory 10 being tested are branched into two paths. One path of 8 bit lines is fed to data register 14, while the other branching path of 8 information bit-lines goes directly to the digital comparator $22_a$. The PROM 10 being tested thus provides, at connection point K, output lines to data register 14 which momentarily latches the data and then, upon activation of the data register clock signal 34, places said data bits on the output lines designated $K_a$ for use of the digital comparator $22_a$. The other path, via direct output line from the PROM 10 to the digital comparator $22_a$, is designated as $K_b$.

As seen in FIG. 4B, the address transition to the PROM starts the test cycle. This is at time $T_0$. Also there is provided a period of time which is regulatable from 30 nanoseconds to 0 nanoseconds in order to cancel skew, drift or temperature errors, etc., via potentiometer 35, FIG. 1.

At the end of this adjustment period, there occurs a point in time $T_1$ where the data clock clocks the data in the data register 14 so that it may be sampled by the comparator $22_a$. Then, during the period from $T_1$ over to $T_2$, the comparator $22_a$ compares the data which had been latched in the data register with the data being directly output from the PROM in order to check that each bit of each word is in exact equal correspondence. This establishes the "valid" or acceptable output condition of the PROM.

The address register 12 is clocked by an address register clock 32 at the time $T_0$ shown in FIG. 4B. The data register 14 is clocked by a data register clock 34 of FIG. 1 which time point is shown as $T_1$ in FIG. 4B. It is at this point that the digital comparator $22_a$ will sample the latched data in data register 14 in order to compare it with the direct data received on bus $K_b$. This sampling and comparison of data by the digital comparator $22_a$ continues to occur until time $T_2$ which represents 500 nanoseconds or one-half clock cycle of the master reference clock 18.

Figure 5:
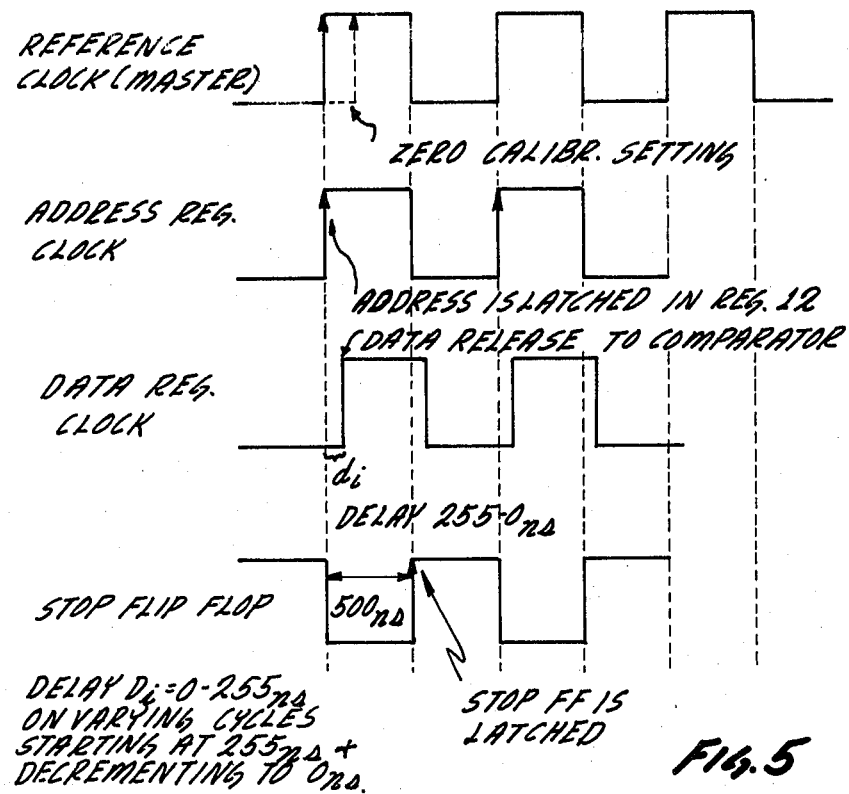
FIG. 5 is a timing diagram illustrating how a control delay is established between the address register clock and the data register clock.
Figure 6:
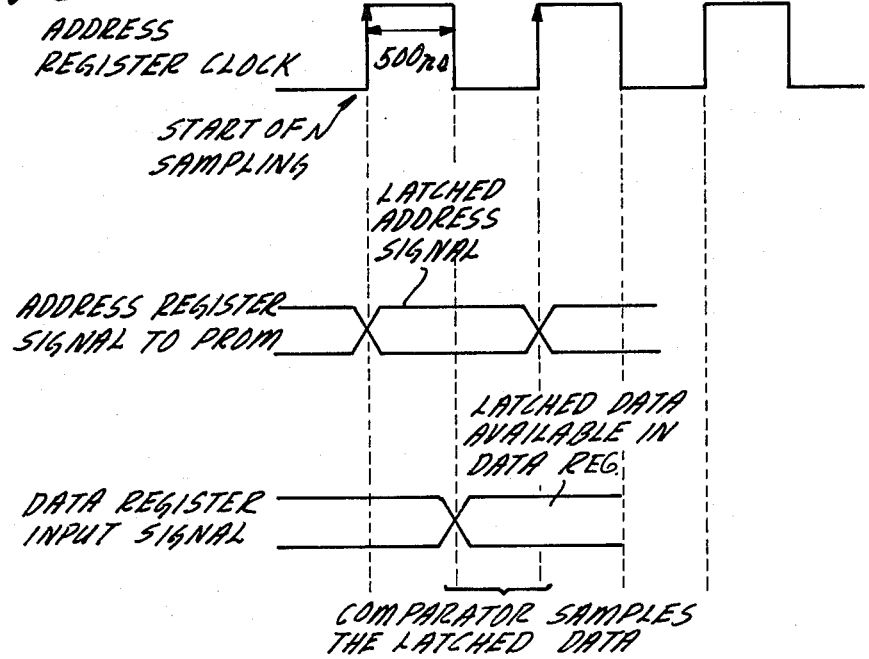
FIG. 6 is a timing diagram illustrating a time delay between addressing the tested memory and the output of reliable data.

It will be seen that there is a time delay between the positive transition of the address clock 32 and the positive transition of the data register clock 34 as will be seen in FIG. 5 and marked as the delay $d_i$. This delay period $d_i$ between the address register clock 32 and the data register clock 34 is a period of time which continuously varies, starting at 255 nanoseconds and decrementing in units of 1 nanosecond and continues decrementing until such time as the stop flip-flop 23 of FIG. 1 is shut off by a signal from the digital comparator $22_a$ which signifies that the comparison of bits between bus $K_a$ and bus $K_b$ is no longer validly correspondent.

The address clock line $36_a$ of FIG. 1 and the data clock line $38_d$, having between them a predetermined delay time $d_i$, are provided as outputs from a digital access control unit 30 shown in FIG. 1. The delay $d_i$ constitutes a test cycle period whereby the delay $d_i$ is a sequential set of cycles whereby at each individual delay period (255 nanoseconds, 254 nanoseconds, 253 nanoseconds,—100 nanoseconds, 99 nanoseconds, 98 nanoseconds,—down to 1 nanosecond)—each of these individual delay periods is used to provide a complete address exercise of the memory 10 and a consequent checkout for output of valid data as between $K_a$ and $K_b$. Should the digital comparator $22_a$, while testing a particular delay period $d_i$, find that the corresponding bits of bus $K_a$ and bus $K_b$ are no longer equal in value (that is, in validity and certainty), then the digital comparator $22_a$ will send a signal to stop flip-flop 23 to shut off the master reference clock 18 which then shuts off the digital down counter 42 and the digital access control unit 30.

Thus, the testing of the memory 10 is done on an "automatic" basis in that memory 10 is plugged into the fixture at J and K, then the push button 40 is depressed to load the digital down counter 42 with a 255 nanosecond value for cycling purposes. This 255 nanosecond value is decremented by a signal from the test pattern generator 20 such that the counter 42 will decrement in steps of 1 nanosecond downward toward 0 nanoseconds. The test cycle from 255 nanoseconds down to 0 nanoseconds would fully occur should the memory 10 be perfect and have a 0 nanosecond access time whereby digital comparator $22_a$ would not have sent a signal to stop flip-flop 23 to shut down the test cycle. Normally there would be a time period, be it 100 nanoseconds, 50 nanoseconds, 30 nanoseconds, etc., whereby the comparison between buses $K_a$ and $K_b$ will become uncertain and invalid, thus causing the stop flip-flop to be activated to shut down the master reference clock 18 and the down counter 42 and the digital access control unit 30.

DIGITAL ACCESS CONTROL UNIT

Referring to FIG. 7, it will be seen that during the rising half-cycle of said master clock 18, there is generated a ramp voltage $R_v$ having a positive increasing slope. This voltage is generated on line $R_v$ of FIG. 1 by the action of the adjustable constant current source 39 and ramp circuit 46 which consists of a bank of capacitors. Circuit 46 is energized by master clock signals 18 via buffer 37.

Analog comparator 36 in FIG. 1 receives a voltage on its minus terminal from zero-adjust potentiometer 35. The plus terminal of analog comparator 36 receives the rising ramp voltage (FIG. 7). When the voltages on the plus and minus terminals are equal, the "offset point" on FIG. 7 establishes the start (rise pulse) of the address clock.

Analog comparator 38 has its positive terminal linked to the ramp voltage $R_v$ while its negative terminal receives a voltage representative of the test-time period being output by the down counter 42.

When the analog voltage from the down counter 42 is equal to the ramp voltage $R_v$, then the DAC (digital access control) point on FIG. 7 is established. At this point in time, the analog comparator 38 puts out the data clock signal which clocks the data register 14 to enable sampling by digital comparator $22_a$ on line $K_a$.

In FIG. 7, the delay period, $d_i$, is seen as that time between the address clock and the data clock rise-pulse signals. This delay period $d_i$ will originate at a 255 ns period and decrement in steps of 1 nanosecond down to 0 nanoseconds unless the stop flip-flop 23 terminates the sequence of testing periods.

At each discrete delay ($d_i$) test time period, the memory under test is fully exercised for output data to the comparator $22_a$.

The slope (FIG. 7) of the ramp voltage $R_v$ is adjustable via the adjustable constant current source 39 of FIG. 1.

The "offset" point in FIG. 7 is used to eliminate skew, temperature drift and other variables. This is done by adjustment of potentiometer 35.

The ramp circuit 46 of FIG. 1 provides a positive increase in voltage to the positive terminals of each of the analog comparators 36 and 38. The ramp voltage line $R_v$ shown in FIG. 7 is initiated by the positive transition of the reference master clock 18. Ramp circuit 46 is fed by buffer 37 which is clocked by reference clock 18.

Analog comparator 36 has its negative (or minus) connection to a potentiometer 35 which is used for zero adjust in order to cancel drift and skew. Analog comparator 38 has its negative (or minus) terminal fed from an operational amplifier 45 which is supplied by the digital analog converter 44. Converter 44 is activated by the digital down counter 42 which has digital voltage pulses representative of varying time periods.

Thus, in both cases the ramp voltage (from circuit 46 and source 39) is used as a basis of comparison against in one case the analog representation (on the negative terminal of 38) of the digital down counter 42, and in the other case an analog voltage (on the negative terminal of 36) which has been used to cancel drift and skew, thus setting a base point of reference.

The digital down counter 42 is clocked by the master reference clock 18 and is started by depression of push button 40 at which time the digital down counter 42 is loaded with a 255 nanosecond time output signal. After the memory 10 is fully exercised at the 255 nanosecond delay time level $d_i$, it is then decremented by the test pattern generator 20 so as to provide a 254 nanosecond time signal during which the memory 10 is again fully exercised and compared by the digital comparator $22_a$. The digital down counter has an output line which feeds into the digital access control unit 30 and specifically to digital analog converter 44. The output of converter 44 is fed to an operational amplifier 45 providing an output to the negative side of analog comparator 38. The positive input to analog comparator 38 is a ramp voltage $R_v$ which is provided by ramp circuit 46 operating with the adjustable constant current source 39 and being clocked through buffer 37 from reference clock 18. Analog comparator 38 provides the data clock signal to the data register clock 34 and data register 14.

The analog comparator 36 has its positive input provided through the ramp voltage line $R_v$ while the negative input to comparator 36 is a zero adjust potentiometer 35. The output of digital analog converter 44 is normally held at a positive level through resistor 48.

The analog comparator 36 provides an address clock output line to the address register clock 32.

As will be seen in FIG. 7, the ramp voltage $R_v$ is initiated on the positive transition of the reference master clock. The ramp voltage rises to the "offset" point which has been set by the zero adjust potentiometer 35. It is at this point that the address clock will transition in the positive direction causing the address register 12 to place the address signals on the memory 10.

During the positive transition of the master reference clock, the ramp voltage $R_v$ continues to rise to the point (FIG. 7) labelled DAC at which time comparator 38 will place an output signal to the data register clock 34 which will clock the latched data from data register 14 onto the bus lines $K_a$ for comparison by the digital comparator $22_a$.

TEST PATTERN GENERATOR

Figure 2:
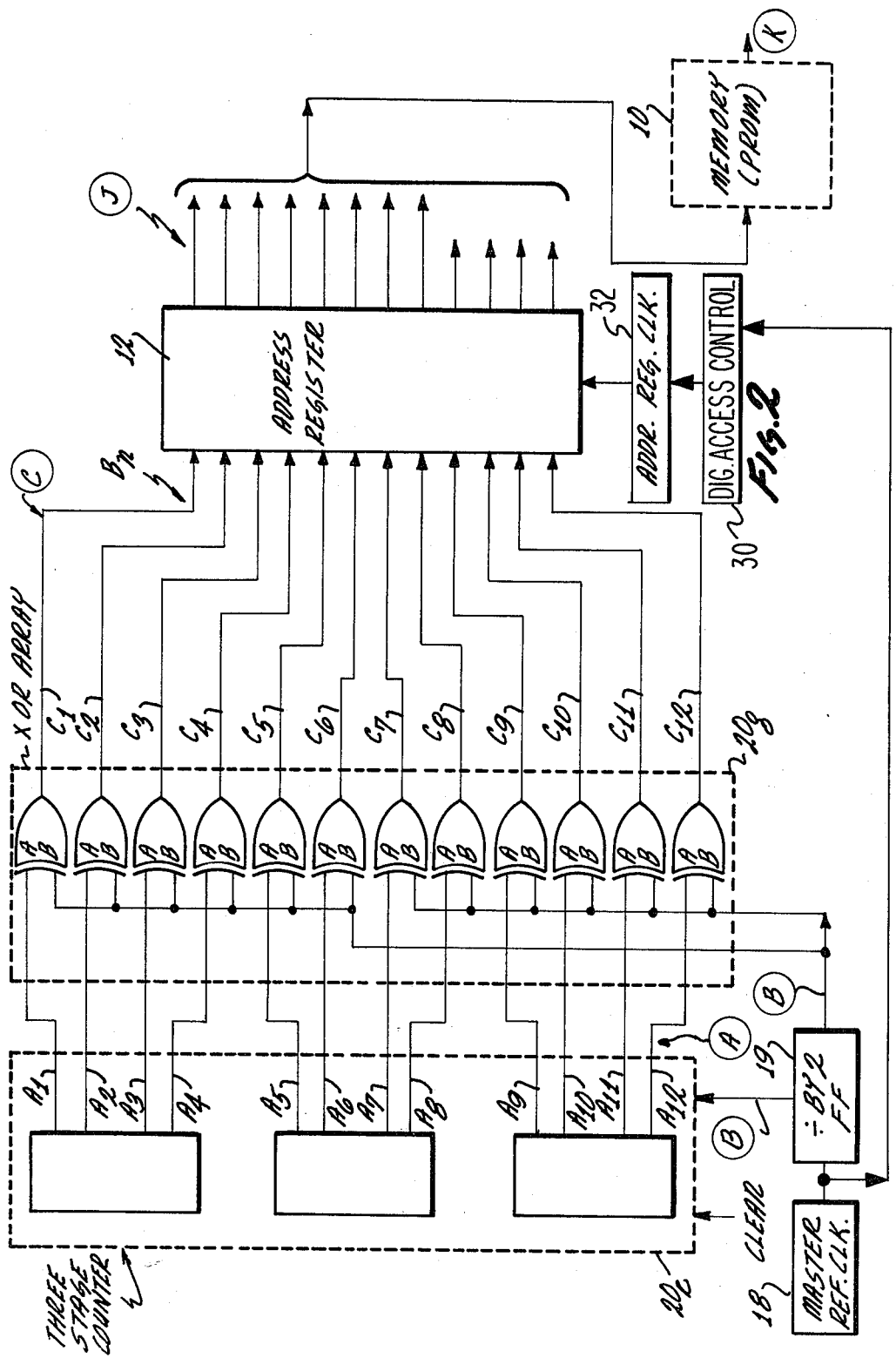
FIG. 2 is a schematic drawing showing the basic elements of the test pattern generator which generates a sequence of addresses.

In FIG. 2 there is shown a test pattern generator 20 which provides address signals to an address register 12. The address register latches these address signals until such time as there occurs a positive transition of the address register clock 32 which places the address signals onto the memory 10.

The test pattern generator 20 primarily consists of a three stage counter $20_c$ having outputs A from each stage which feed to individual Exclusive OR gates in gate unit $20_g$. The second input to each of the Exclusive OR gates, which is designated as input B, is derived from a divide-by-two-flip-flop 19 which is clocked by the master reference clock 18. The output B is also fed to the three stage counter for clocking purposes.

The test pattern generator 20 provides a particular sequential pattern which might be described as an increment-complement output address pattern. This pattern is such that after the initial address is provided to the address register, then the address is complemented to provide the next address. Then the original address, for example 001, is incremented to provide an output address signal of 011. Then the 011 address is complemented to give 100. Now the 011 former address is incremented to give an address of 111. This increment-decrement pattern is shown in the following table below where a, b, c, d, and e show the increment complement transitions.

Thus, the test pattern generator 20 can operate on the pattern of choosing an address and then complementing it, such as:

| | | | |
|---|---|---|---|
| a | $a_1$ | Address 001 | Initial address |
| | $a_2$ | Address 110 | Complement of initial address |
| b | $b_1$ | Address 011 | Increment of $a_1$ |
| | $b_2$ | Address 100 | Complement of $b_1$ |
| c | $c_1$ | Address 111 | Increment of $b_1$ |
| | $c_2$ | Address 000 | Complement of $b_i$ |
| d | $d_1$ | Address 100 | Increment of $c_1$ |
| | $d_2$ | Address 011 | Complement of $c_1$ |
| e | $e_1$ | Address 110 | Increment of $d_1$ |
| | $e_2$ | Address 001 | Complement of $e_1$ |

By this means of addressing the PROM memory 10 to be tested, there is exercised all the combinations of the matrix, that is, all the row and column combinations that can be addressed plus the complement (transition) of each address.

This means of generating addresses for the PROM memory test cycles will exercise all the combinations of the matrix, that is all the row and column combinations that can be exercised. This can be done very rapidly or in a matter of time less than 500 nanoseconds so that a complete test cycle of any given access time can be effectuated during one-half clock of the master reference clocking cycle.

This address generation pattern is deemed to be much more effective than the standard types of $N^2$ test generator pattern which involve complex programming and include multiple redundancy of transitions which take considerable periods of time for accomplishment. The increment-complement address pattern actually makes use of the most effective part of the old $N^2$ patterns, this being those address changes where the most transitions occur, that is the most active transition areas.

The increment-complement generation system eliminates the redundancies in the $N^2$ system and further exercises all the rows and columns of the PROM drivers in a fashion whereby addresses are sequenced through the pattern shown in the above cited table, which tests the "worst case" transitions.

The Exclusive OR circuits of FIG. 2 can be looked upon as programmed inverters, which do the action of complementing or not complementing and provide addresses which exercise all the combinations of the rows and the columns, the result being that the test pattern generator provides an exercise of the general worst case situations of any PROM which could be tested.

OPERATION OF TEST PATTERN GENERATOR

With reference to FIG. 2, activation of push button 40 (FIG. 1) will "clear" the counter $20_c$ so that all counter output lines $A_1$-$A_{12}$ are equal to zero (0). This action will also reset the halt or stop flip-flop 23 (FIG. 1). The counter $20_c$ is an "up" counter which increases its digital output as it gets clocked.

Activation of push button 40 will also reset digital down counter 42 to all "1"s since this counter 42 is a "down" counter which starts at its high value and counts down to lower values. The initial counter value of counter 42 represents a 255 nanosecond test period.

In FIG. 2 the up counter $20_c$ will initially present all "0"s on output lines $A_1$ through $A_{12}$. These lines are each connected to the "A" input of a separate Exclusive OR gate situated in a parallel gate array unit $20_g$.

The master clock 18 energizes a divide-by-two flip-flop 19. Flip-flop 19 has an output B which clocks the up counter $20_c$ and provides a series of clock lines B to each Exclusive OR gate in array $20_g$.

Thus, each of the bit-lines $A_1$-$A_{12}$ will have their information content appear on output lines $C_1$-$C_{12}$ in a sequence of address patterns. Thus, the initial address lines $A_1$-$A_{12}$ will first appear (at $C_1$-$C_{12}$) as 0000 0000 0000 before the flip-flop 19 goes into its transition to "1".

When this occurs, the OR gates act as inverters and all the output address lines become 1111 1111 1111. Thus, the initial "zeros" address has been complemented.

At the next clock, the counter $20_c$ will have its output address lines ($A_1$-$A_{12}$) incremented up by "one" so as to constitute 0000 0000 0001

Now when the clock signal on line B transitions to "1", then the Exclusive OR gates will invert the address signal at C($C_1$-$C_{12}$), to read 1111 1111 1110 which is the complement of the previous address.

Thus, there is generated a sequence of output addresses which follow this pattern:
$a_1$ = initial address
$a_2$ = complement of $a_1$
$a_3$ = $a_1$ incremented by "1"
$a_4$ = complement of $a_3$
$a_5$ = $a_3$ incremented by "1"
$a_6$ = complement of $a_5$
and so on.

Another expression of this sequence could be:

$$a_1 = \overline{a_2}$$

$$a_2 = a_2$$

$$a_3 = \overline{(a_2+1)}$$

$$a_4 = (a_2+1)$$

Thus, when flip-flop 19 is "low" (0), there is no inversion of the value of signal lines A and signal lines C. For example here, if the outputs ($A_1$-$A_{12}$) from counter $20_c$ are all "zeros", then the address lines ($C_1$-$C_{12}$) to address register 12 will all be "0" also.

When flip-flop 19 goes "high" (1) at its rising edge, then the B inputs to each Exclusive OR gate will invert the signal at C to be the complement of the input signal at A.

The rising edge (0-1) of the flip-flop 19 increments the counter $20_c$ by 1 count.

In FIG. 1, it should be noted that the master clock 18 also operates through buffer 37 to initiate a ramp voltage $R_v$ through ramp circuit 46. This ramp voltage will enable a "test-pass period" of 255 nanoseconds (initially). During this "test pass" period, there will occur $2^{12}$ increments to counter $20_c$ which will exercise all the row and column combinations of memory 10. This "test-pass period" is next run at 254 ns, 253 ns, 252 ns—until the stop flip-flop 23 shuts off the master clock 18.

It may be indicated that no large units of control logic are required here in that the counters operate as "sequencers" and perform their natural function.

The down counter 42 controls the sequences of test-passes which will reveal the access time of memory-under-test 10 to the point where unreliability occurs. The test pattern generator 20 generates the test-pattern addresses for each test-pass period.

DIGITAL COMPARATOR CIRCUITRY

The digital comparator 22 may be of the type, for example, as cited on page 7-64 of the Texas Instruments Company TTL Data Book, 2nd edition, 1976. The output of this type of digital comparator involves three output signal lines which represent the condition of "greater than", the condition of "equal to", or the condition "less than".

The first digital comparator $22_a$ when it detects an uncertainty or inequality of comparison between its two input bus lines will signal a "stop" flip-flop which will turn off the master reference clock and end the cycle of testing activity. Then and only when the "stop flip-flop" 23 has been triggered by an error signal, only then will the digital comparator $22_b$ operate to check the standard threshold value (set by the thumbwheel) against the time period it took from the start of a test until non-equality (or activation of the stop flip-flop 23) in order to tell, via an output signal, whether the "time period-to-reach-the-error-point" was greater in value than the standard threshold value, thus displaying the memory as not acceptable.

As seen in FIG. 1, the digital comparator $22_a$ receives two input bus lines designated as $K_a$ and $K_b$. As seen in FIG. 3, $K_b$ and $K_a$ may consist of eight separate information bit lines. The data on the eight bit-lines of $K_a$ and $K_b$ are derived from the same source connection point at K.

The data signals on the eight bit-lines of $K_a$ come from the data register 14 where they have had a chance to settle down by having been latched for a period in the data register 14. The data on the bit-lines of $K_b$ come directly from the point K.

At each discrete delay period of $d_i$ (FIG. 5) the output data from the address memory 10 is checked for equal correspondency. When this equal correspondency occurs, the output data from memory 10 is seen to be valid stable data.

The second digital comparator $22_b$ has a digital value input line D which is derived from the digital down counter 42. This presents to the comparator $22_b$ a present moment indication of the nanosecond time period being tested for. This value of D is shown on the access time display unit 25 which access time unit will indicate each of the nanosecond time-test periods from 255 nanoseconds on downward in decrements of 1 nanosecond.

Another input to the digital comparator $22_b$ is the settable thumbwheel 25 which provides an output signal X which represents the minimum access time for a PROM memory to be considered acceptable. Thus, if a memory 10 being tested shuts off the stop flip-flop 23 before reaching the value of X (D greater than X), then the "reject" display light 26 will light up telling the operator that the PROM 10 is unacceptable. On the other hand if the digital shown counter and the digital value D continues to decrement to a value which is lesser than the value of the standard X, then it is seen that the access time on the tested PROM 10 is better than the standard access time required by the thumbwheel setting $25_t$, and the "acceptable" display light 24 will turn on.

It should be noted that when the stop flip-flop 23 is activated to stop the test periods, other possibilities of test information may be accommodated other than just access time.

For example, a display unit could be connected to address register 12 to display the actual address used when a non-correspondence (failure) of data occurred between lines $K_a$ and $K_b$.

Similarly, Exclusive OR gates could be connected between each corresponding information-bit line of $K_a$ with that of $K_b$ so that a display unit would indicate exactly "which bits" of memory-output-data have failed to correspond in equality. Thus, many possibilities of gathering test data are available.

The apparatus described herein provides an unexpensive yet fast (1 second or less) system for establishing the reliable access time period for an IC memory such as a PROM.

It should be indicated that other type tests are readily applicable. For example, in FIG. 1, the memory 10 can be subjected to temperature variations while being exercised. Thus, its operational capability under temperature variations may be analyzed. Likewise, test of memory 10 can be executed while predictably varying the base voltage applied to it, thus also analyzing its behavior under those conditions.

There has been described herein an automatic apparatus for the testing of access time in an integrated circuit memory by which a relatively untrained operator can plug in the memory to be tested, press an initiation button and read out whether the memory is acceptable or rejectable according to a standard set by a thumbwheel time setter. Further, by use of an access time unit, the access time period of the reliability for the memory can be established and identified. The technique and apparatus accomplishes this with merely a few hundred dollars of equipment and in less than one second of time per test compared to the automated test equipment of prior days which required hundreds of thousands of dollars and hours of test time to test a single memory device.

It should be understood that the technique and circuitry described here may be effectuated and accomplished with other equivalent forms of circuitry and devices and it should be understood that the invention is not limited to the specific apparatus involved, but rather is to be defined by the scope of the following claims.

What is claimed is:

1. A memory testing apparatus for testing integrated circuit memories comprising:
   (a) a semi-conductor memory for undergoing test;
   (b) means for generating a pattern of addresses for addressing areas of data in said memory undergoing test;
   (c) address register means for latching said addresses from said generating means;
   (d) means for clocking said address register means to initiate access to data in said memory undergoing test, said means being periodically initiated by a signal from a delay circuit means at a time $T_a$;
   (e) data register means for latching output data accessed from said memory undergoing test;
   (f) first and second output bus means from said test memory for simultaneously transmitting accessed output data respectively to said data register means and directly to a digital comparator means;
   (g) third bus means for transmitting said accessed output data from said data register means to said digital comparator means;
   (h) delay circuit means for setting a time delay between the clocking of said address register means and the clocking of said data register means, said delay means providing a first clocking signal to said address register means at a time $T_a$ and a second clocking signal to said data register means at a time $T_d$, said delay circuit functioning to adjust the said time delay proportional to the output of a digital down counter which establishes the length of the test period (cycle) whereby comparison is made between the output data transferred from said semiconductor memory at time $T_a$, with output data at time $T_d$;
   (i) a digital down counter for generating a series of test periods, said test periods varying from a large number of nanoseconds down to 1 nanosecond, said down counter receiving an input-decrementing signal from said test generator which decrements each test period by 1 nanosecond, also receiving clock signals from a master reference clock; and wherein said down counter provides digital test time-period signals to said delay circuit means, to a display read-out means and to a digital comparator means;
   (j) a master reference clock for clocking said test pattern generator, said down counter, said delay circuit means, and said digital comparator means;

(k) digital comparator means for comparing the equality of accessed output data from memory on the said first and third bus means and including:
  (k-1) signal output means in said digital comparator means which is connected to said master clock via a stop flip-flop to stop said master clock and abort the continuing decremented test periods, said signal output being initiated upon an occurrence of non-equality of accessed data on said second and third bus means;
  (k-2) means to read-out the specific nanosecond time of the test period at which a non-equality occurred between said first and third bus means, said means to read-out including:
    (k-2a) an input signal from said digital down counter to display the time count of said digital down counter when said digital down counter is no longer being clocked by said master clock.

2. The apparatus of claim 1, wherein said test pattern generator generates addresses which exercise all combinations of the column and row drivers in said memory undergoing test.

3. The apparatus of claim 1, wherein said delay circuit means includes:
(i4) a ramp voltage circuit triggered by said master clock which generates a rising voltage during each first ¼ clock period of said master reference clock, said ramp voltage circuit including:
  (i4-1) an adjustable constant current source connected to a capacitor bank and to a second input terminal of each of a first and second analog comparator;
  (i4-2) a ramp circuit output line connected to each of said second input terminals;
  (i4-3) a buffer which receives clock signals from said master reference clock to provide an output to said ramp circuit;
  (i4-4) a capacitor bank connecting said buffer to said ramp circuit output line;
  (i4-5) first and second analog comparators which respectively provide an address clock output signal and a data clock output signal, said address clock signal and said data signal having a time delay, $d_i$, therebetween, and wherein each analog comparator has a first and second input terminal;
  (i4-6), digital-analog conversion means for converting digital time signals from said down-counter into analog voltage signals which connect to said first terminal of said second analog comparator;
  (i4-7) connection means connecting said ramp output line to the second input terminals of each of said first and second analog comparators;
  (i4-8) connection means from a zero adjust potentiometer to said first input terminal of said first analog comparator.

4. The apparatus of claim 3, wherein the said time delay, $d_i$, constitutes the period from the zero time set by said zero-adjust potentiometer until the time the analog voltage value of the down counter is equal to the ramp voltage on the second analog comparator.

5. The apparatus of claim 1, wherein said digital comparator means includes:
(i7-1) a first comparator for simultaneously sampling the data on said second bus and third bus to determine equality of correspondence thereof or non-equality of correspondence thereof;
(i7-2) a second comparator connected to receive signals from said first comparator as to the equality or non-equality of data accessed from memory.

6. The apparatus of claim 5, wherein said means to stop said test periods includes:
(8i-1) a flip-flop clocked by said master reference clock and receiving non-equality signals from said first digital comparator, said flip-flop operating to stop said master clock upon receipt of a non-equality signal.

7. The apparatus of claim 6, wherein said digital comparator means includes:
an access time display which displays the value of the test period at the moment the non-equality signal stopped said flip-flop.

8. The apparatus of claim 5, wherein said second comparator includes:
(i-9) adjustable time-setting means to set a time-standard of acceptance signal (X);
(ii-9) digital test-period time signals (D) from said down counter;
(iii-9) first (acceptable) display means and second (reject) display means;
(iv-9) means to activate said first display means when signal D is less than or equal to signal X;
(v-9) means to activate said second display means when signal D is greater than signal X.

9. A method for testing semi-conductor memories comprising the steps of:
(a) generating a memory address into an address latch;
(b) clocking said address-latch address into said memory at a selected time-moment $T_a$;
(c) accessing output data from an addressed location in said memory into a data latch register;
(d) simultaneously and directly conveying said accessed output data from the same addressed location to a digital comparator means via a data clock at a time $T_a$;
(e) comparing at a subsequent time $T_d$ the equality of data from said data latch register with data conveyed directly to said comparator means, said comparisons occurring by a test at each nanosecond test period starting from N nanoseconds and decremented down to 1 nanosecond;
(f) stopping the test when non-equality is detected;
(g) determining the nanosecond value of the test period which existed at the moment of detection of non-equality of compared data;
(h) wherein time $T_a$ represents the start of a single time-test period when said address latch releases an address to said semiconductor memory whereby data accessed from said address is conveyed to said comparator means and also to said data latch register, and wherein time $T_d$ represents the subsequent time that data is released from said data latch register for comparison with data directly conveyed to said comparator means.

10. The method of claim 9 including the step of:
(d-1) automatically adjusting the time period of delay between $T_a$ and $T_d$.

* * * * *

UNITED STATES PATENT AND TRADEMARK OFFICE
CERTIFICATE OF CORRECTION

PATENT NO. : 4,430,735
DATED : February 7, 1984
INVENTOR(S) : Robert D. Catiller It is certified that error appears in the above-identified patent and that said Letters Patent is hereby corrected as shown below:

Col. 11, line 34, change "shown" to --down--.

Col. 13, line 27, change "¼" to --½--.

Signed and Sealed this

Fifteenth Day of May 1984

[SEAL]

Attest:

GERALD J. MOSSINGHOFF

Attesting Officer

Commissioner of Patents and Trademarks